United States Patent [19]

Konaka et al.

[11] Patent Number: 4,523,213
[45] Date of Patent: Jun. 11, 1985

[54] MOS SEMICONDUCTOR DEVICE AND METHOD OF MANUFACTURING THE SAME

[75] Inventors: Masami Konaka, Kawasaki; Hiroshi Iwai, Tokyo; Yoshio Nishi, Yokohama, all of Japan

[73] Assignee: VLSI Technology Research Association, Tokyo, Japan

[21] Appl. No.: 396,843

[22] Filed: Jul. 9, 1982

Related U.S. Application Data

[63] Continuation of Ser. No. 144,837, Apr. 29, 1980, abandoned.

[30] Foreign Application Priority Data

May 8, 1979 [JP] Japan .................................. 54-55870

[51] Int. Cl.$^3$ ........................................... H01L 29/78

[52] U.S. Cl. ................................. 357/23.7; 357/23.8; 357/23.6; 357/23.11; 357/23.12; 357/23.3; 357/23

[58] Field of Search .................... 357/23.7, 23.8, 23.5, 357/23.6, 23.11, 23.12, 23.3, 23 R

[56] References Cited

U.S. PATENT DOCUMENTS 3,514,676 6/1976 Fa ........................................ 357/23.7
4,023,195 5/1977 Richman ......................... 357/23.11

*Primary Examiner*—Martin H. Edlow
*Attorney, Agent, or Firm*—Finnegan, Henderson, Farabow, Garrett & Dunner

[57] ABSTRACT

An MOS semiconductor device, wherein a buried region of silicon oxide or silicon nitride extends partly over the bottom plane of the channel region of an MOS transistor.

8 Claims, 16 Drawing Figures

MOS SEMICONDUCTOR DEVICE AND METHOD OF MANUFACTURING THE SAME

This is a continuation of application Ser. No. 144,837, filed 4/29/80 now abandoned.

BACKGROUND OF THE INVENTION

This invention relates to an MOS semiconductor device, and more particularly to an MOS semiconductor device having a short channel and a method of manufacturing the same.

In recent years, noticeable development has been made in the high integration of an electric circuit, resulting in the extreme miniaturization of circuit elements. The miniaturization of circuit elements is indeed useful for the high speed operation of a semiconductor device. However, the more advanced the miniaturization, the more adversely affected the property of the semiconductor device. For example, with an MOS transistor having a short channel, impression of a drain voltage tends to give rise to a punch-through effect in a region defined between the source and drain of a transistor. This event deteriorates the drain current-gate voltage characteristics in a subthreshold range. In other words, the short channel type MOS transistor has the drawback that a punch-through current readily flows through the MOS transistor, thereby obstructing the complete pinch-off of the drain current. Such occurrence leads to the difficulty that, for example, in an MOS dynamic RAM (random access memory), data stored in the form of an electric charge tends to leak.

To suppress leakage current resulting from the punch-through effect arising in the above-mentioned short channel type MOS transistor, the conventional process comprises providing a layer of a high impurity concentration in the deep portion of the channel region. However, the provision of such a deeply embedded impurity layer at high concentration gives rises to an increase in the threshold voltage of the resultant MOS device. Further, the threshold voltage is largely governed by a bias voltage impressed on a substrate, presenting difficulties in designing an integrated circuit for an MOS semiconductor device.

SUMMARY OF THE INVENTION

It is accordingly an object of this invention to provide a short channel type MOS semiconductor device in which leakage current caused by the punch through effect is effectively prevented from being increased and a method of providing this short channel type MOS semiconductor device.

Another object of the invention is to provide a short channel type MOS semiconductor device in which an electrically insulating layer extends partly over the bottom plane of the channel region.

Still another object of the invention is to further provide a method of manufacturing a short channel type MOS semiconductor device, which comprises the steps of;

implanting oxygen or nitrogen ions in an area adjacent to that part of the substrate in which at least a channel region is formed before the formation of source, drain and gate regions; and thereafter applying heat treatment to produce an oxidized or nitrogenized semiconductor region.

DETAILED DESCRIPTION OF THE PREFERRED EMBODIMENTS

Figure 1:
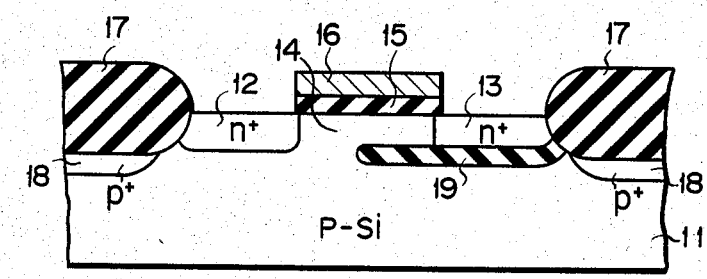
FIG. 1 shows the structure of an MOS semiconductor device according to one embodiment of this invention.

With the embodiment of FIG. 1, an N+ type source region 12 and N+ type drain region 13 are formed in a P type silicon substrate 11. A silicon oxide layer 15 acting as a gate insulating layer is formed on a channel region 14 defined between the source and drain regions 12 and 13. A polycrystalline silicon layer 16 acting as a gate electrode is formed on the silicon oxide layer 15. A field oxide layer 17 is formed on silicon substrate 11 to surround the source, drain and channel regions 12, 13 and 14. A P+ type channel stopper region 18 is formed below the field oxide layer 17. Formed in the silicon substrate 11 is a buried solid insulating region 19 which extends inward from the P+ type channel stopper region 18, passes along the bottom plane of the drain region 13 and reaches the substantially intermediate point of the channel region 14. This buried insulating region 19 is formed of an electrically insulating material, such as silicon oxide.

As described above, the buried insulating region 19 extends partly over the bottom plane of the channel region 14. Even where, therefore, a short MOS FET channel region is provided, the occurrence of a depletion layer and consequently a punch-through phenomenon is restricted between the source and drain regions. Since the buried insulating region 19 is formed of an electrically insulating material, it is possible to reduce further the rise of a threshold voltage or variations therein, thereby enabling the subthreshold region to have better drain current-gate voltage characteristics than in the prior art MOS FET transistor. Since the buried insulating region 19 extends along the bottom of the drain region 13, the junction between the drain region and substrate has a smaller charge capacity, offering great advantage in the high speed operation of an MOS semiconductor device. The further merit of this invention is that a bias voltage can be applied to the substrate, enabling a threshold voltage to be set at a proper value.

Figure 2A:
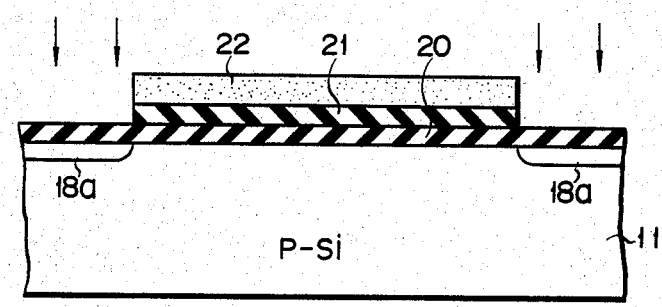
FIGS. 2A to 2E illustrate the structures of the interim forms of the MOS semiconductor device of FIG. 1 which correspond to the sequential steps of manufacturing the MOS semiconductor device.

Description is now given of the method of manufacturing an MOS FET element embodying this invention. Referring to FIG. 2A, a silicon oxide layer 20 is formed on a P type silicon substrate 11. Thereafter a silicon nitride layer 21 is formed on the silicon oxide layer 20. A photoresist emulsion layer 22 is coated on the silicon nitride layer 21. The silicon nitride layer 21 is selectively photoetched. Then, ions of boron 18a are implanted in the silicon substrate 11 through the silicon oxide layer 20. The implanted boron ions 18a are activated.

Figure 2B:
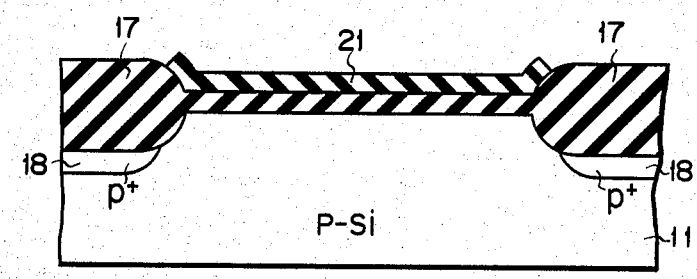
Figure 2C:
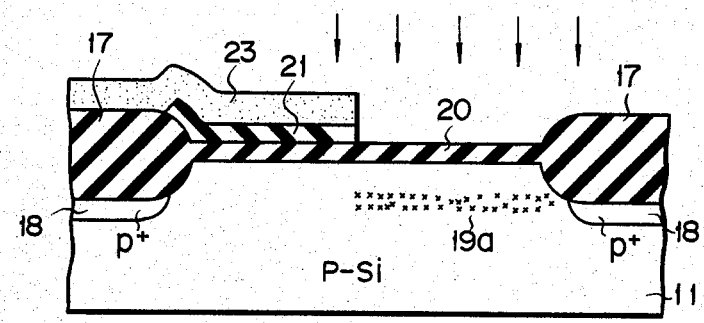

After the photoresist emulsion layer 22 is taken off, high temperature oxidation is applied through the silicon nitride layer 21, thereby producing the field oxide layer 17 having a thickness of about 1 micron and channel stopper 18 (FIG. 2B). In the step of FIG. 2C, a photoresist emulsion layer 23 is over the whole of an area later acting as a source region and part of an area later acting as a channel region. The silicon nitride layer 21 is selectively removed through the photoresist emulsion layer 23. Thereafter, as shown in FIG. 2C, oxygen ions 19a are implanted at an acceleration voltage of 150 KeV and dose rate of $1 \times 10^8/cm^2$.

Figure 2D:
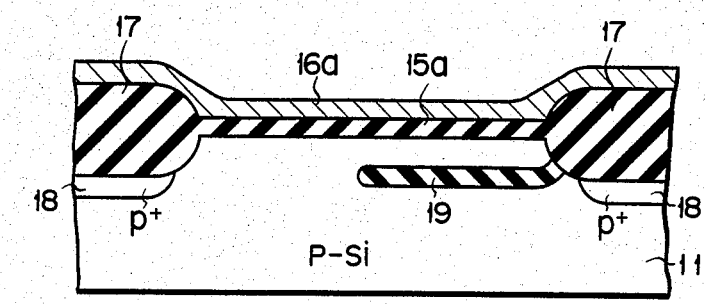

After the removal of the photoresist emulsion layer 23, heat treatment is carried out at a high temperature of 1000° C. As a result, the buried silicon oxide region 19 is formed (FIG. 2D). The silicon nitride layer 21 and silicon oxide layer 20 are later removed to expose part of the surface of the substrate 11. A silicon oxide layer 15a constituting a gate insulating layer 15 is formed by thermal oxidation on the exposed surface of the substrate 11. Thereafter, a polysilicon 16a used as a gate electrode 16 is deposited all over the silicon oxide layer 15a and field oxide layer 17 (FIG. 2D).

Figure 2E:
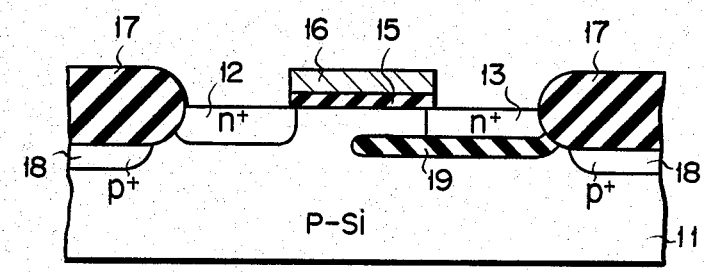

As shown in FIG. 2E, the polysilicon layer 16a and oxide layer 15a are selectively etched except for those portions which respectively constitute the gate electrode 16 and gate insulating layer 15. After the etching, for example, phosphorus is diffused in the substrate 11 to form the N+ type source region 12 and drain region 13.

The MOS FET element of FIG. 1 is fabricated through the above-mentioned steps. An oxide film is generally formed by chemical vapor deposition all over the surface of the MOS FET element shown in FIGS. 1 and 2E. Thereafter, an electrode leadout operation is carried out through the steps of forming a contact hole, thermally depositing an aluminum film and patterning. With the above-mentioned MOS FET-manufacturing method, the buried insulating region 19 is formed by a simple process consisting of ion implantation and heat treatment. The formation of the buried insulating region is undertaken, before the source, drain and gate regions are formed. Therefore, the principal steps of manufacturing an MOS FET device do not substantially change. Consequently, the property of the MOS FET element is little likely to be deteriorated during manufacture.

Figure 3A:
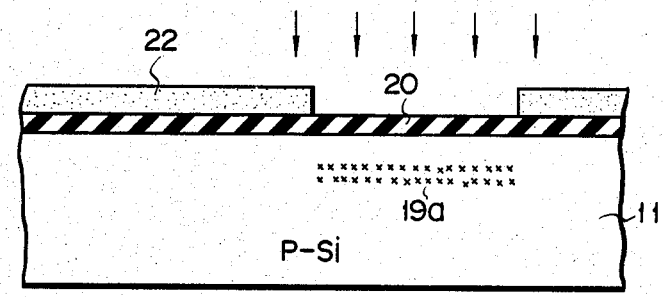
FIG. 3A to 3E indicate the structures of the interim forms of the MOS semiconductor device of FIG. 1 which correspond to the sequential steps of manufacturing the MOS semiconductor device by a different method.

Description is now given with reference to FIGS. 3A to 3E of the method of manufacturing an MOS FET device according to another embodiment of this invention. Referring to FIG. 3A, a silicon oxide layer 20 is deposited on a P type silicon substrate 11. A photoresist emulsion layer 22 is coated on the silicon oxide layer 20. Oxygen ions 19a are implanted in the silicon substrate 11 through that portion of the silicon oxide layer 20 which is not coated with the photoresist emulsion layer 22 under the same condition as described in connection with the step of FIG. 2C.

Figure 3B:
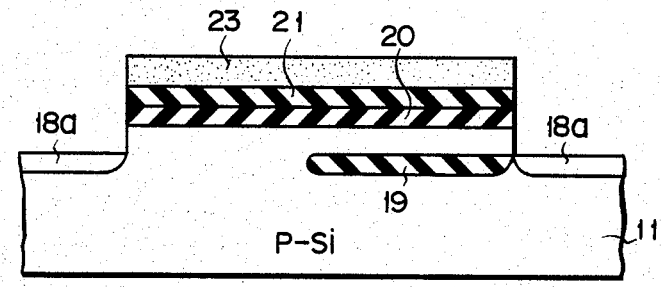

After removal of the photoresist emulsion layer 22, heat treatment is applied to provide a buried silicon oxide region 19 (FIG. 3B). The silicon nitride layer 21 is coated with a photoresist emulsion layer 23. The silicon nitride layer 21 and silicon oxide layer 20 are selectively etched in the order mentioned through the photoresist emulsion layer 23. The exposed portion of the surface of the P type silicon substrate 11 is etched. Thereafter, boron ions 18a are implanted in the substrate 11 to form the P+ type channel stopper region 18. Heat treatment for formation of the buried silicon oxide region 19 need not be carried out immediately after the oxide ion-implanting process, but may be undertaken after the formation of, for example, the silicon nitride layer 21.

Figure 3C:
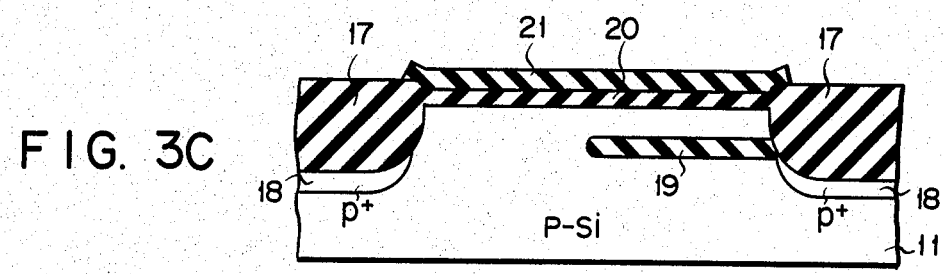

After the photoresist emulsion layer 23 is etched, the field oxide layer 17 and P+ type channel stopper region 18 are selectively subjected to high temperature oxidation through the silicon nitride layer 21 (FIG. 3C). Thereafter, the silicon nitride layer 21 and silicon oxide layer 20 are etched to expose part of the surface of the P type silicon substrate 11.

Figure 3D:
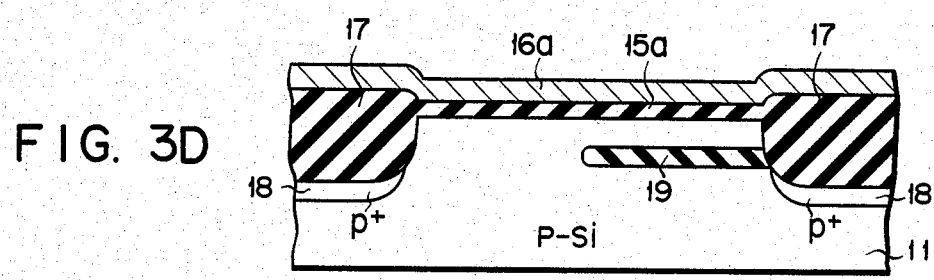
Figure 3E:
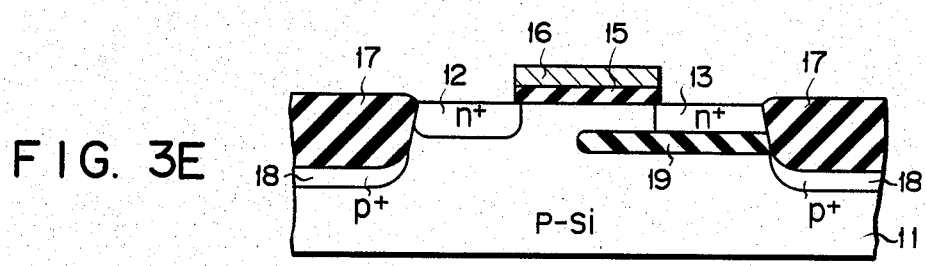

Later, a silicon oxide layer 15a acting as a gate insulation layer 15 is deposited by thermal oxidation (FIG. 3D). A polysilicon layer 16a acting as a gate electrode 16 is formed on the silicon oxide layer 15a by chemical vapor deposition. As shown in FIG. 3E, the polysilicon layer 16a and silicon oxide layer 15a are selectively etched so as to retain the gate electrode 16 and gate insulating layer 15. Thereafter, phosphorus is diffused in the P silicon substrate 11 to produce an N+ type source region 12 and drain region 13.

According to the MOS semiconductor device-manufacturing method whose steps are indicated in FIGS. 3A to 3E, a certain portion of the P type silicon substrate 11 is previously etched to allow for the formation of the field oxide layer 17 therein. Therefore, the surface of the MOS semiconductor device is smoothed, offering advantages in preventing wiring from being broken at the sharp stepped portions of the MOS semiconductor device which might otherwise appear and providing flat multilayer wiring.

Figure 4:
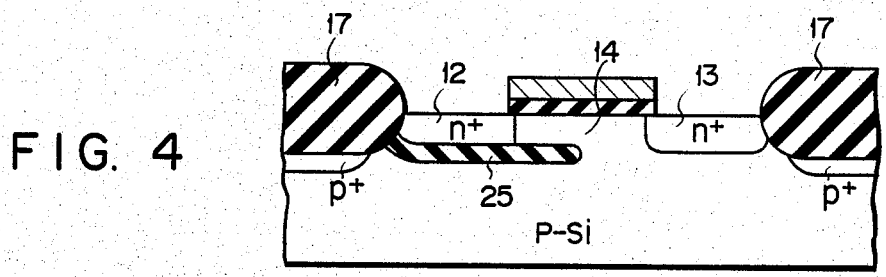
FIG. 4 sets forth the structure of an MOS semiconductor device according to still another embodiment of the invention in which a buried insulating region is set on the side of a source region.

FIGS. 4 to 8 illustrate various modifications of an MOS semiconductor device embodying this invention. Referring to FIG. 4, a buried insulating region 25 extends inward from the field oxide layer 17, passes along the bottom plane of the source region 12 and is stretched over part of the bottom plane of the channel region 14.

Figure 5:
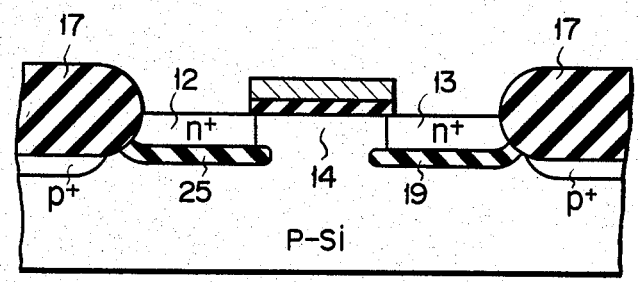
FIG. 5 shows the structure of an MOS semiconductor device according to still another embodiment of the invention in which buried insulating regions are formed on the sides of the source and drain regions respectively.

In FIG. 5, a buried insulating region 25 extends inward from the field oxide layer 17 and passes along the bottom plane of the source region 12. Similarly, a buried insulating region 19 extends inward from the field oxide layer 17, and passes along the bottom plane of the drain region 13.

Figure 6:
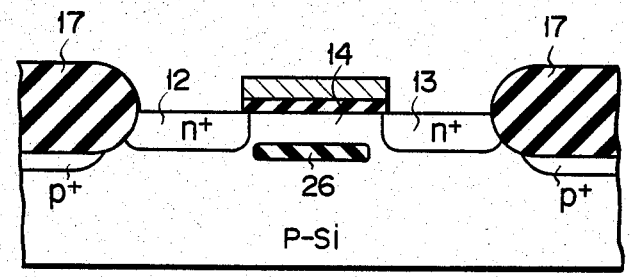
FIG. 6 illustrates the structure of an MOS semiconductor device according to a further embodiment of the invention in which a buried insulating region extends partly over the bottom plane of a channel region.
Figure 7:
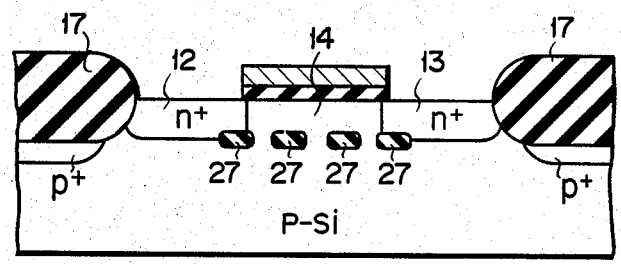
FIG. 7 indicates the structure of an MOS semiconductor device according to a further embodiment of the invention in which a plurality of buried insulating regions respectively extend partly over the bottom plane of a channel region.

As shown in FIG. 6, a buried insulating region 26 is so formed as to extend partly over the bottom plane of the channel region 14. As apparent from FIG. 7, a plurality of buried insulating subregions 27 are so formed that they respectively extend partly over the bottom plane of the channel region 14.

Figure 8:
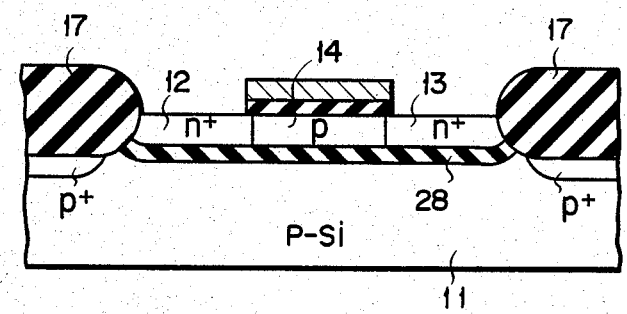
FIG. 8 shows the structure of an MOS semiconductor device according to a still further embodiment of the invention in which a buried insulating region extends all over the bottom planes of the source, channel and drain regions.

In the modification of FIG. 8, a buried insulating region 28 extends all over the bottom planes of the source, channel and drain regions 12, 14 and 13. The modification of FIG. 8, in which the buried insulating region 28 extends, as described above, fully over the bottom planes, has the advantage that it is unnecessary to use a photoetching mask in the step of implanting oxygen ions, but is accompanied with the drawback that a bias voltage can not be impressed on the silicon substrate 11.

Throughout all the foregoing embodiments, a substrate of the same chemical composition is used. However, it is possible to form an ion implantation layer for controlling a threshold value between the silicon substrate 11 and silicon oxide layer 15, thereby providing MOS FET elements of the enhancement and depletion modes. It will be noted that this invention is applicable not only to an N channel MOS device, but also to a P channel MOS device or complementary MOS device. An MOS device embodying this invention which has a selectively oxidized structure has been described in connection with the aforesaid embodiments. However, the invention is also applicable to an MOS device having the ordinary structure. In this case, a gate electrode may be formed of a metal layer prepared from, for example, aluminium or metal silicide.

An MOS semiconductor embodying this invention in which an insulating buried region is formed below the bottom plane of a channel region has the advantages that a punch-through phenomenon arising between the source and drain regions of a short channel type MOS transistor can be effectively suppressed; it is possible to reduce increases or variations in a threshold voltage; and excellent drain current-gate voltage characteristics are indicated particularly in a subthreshold region. According to the MOS device-manufacturing method embodying this invention, a buried insulating region can be easily produced by combination of ion implantation and heat treatment, before the formation of an MOS element, thereby preventing the properties of the MOS element from being deteriorated during manufacture.

What we claim is:

1. An MOS semiconductor device, which comprises:
    a semiconductor substrate of a first conductivity type;
    a source region of a second conductivity type, said source region being formed in said semiconductor substrate;
    a drain region of a second conductivity type, said drain region being formed in said semiconductor substrate;
    a short channel region disposed between said source and drain regions;
    a gate electrode deposited on the channel region through a gate insulation layer; and
    a buried solid insulating region formed in said substrate over at least a part of a bottom plane of the channel region wherein said channel region is integrally coupled with said semiconductor substrate.

2. The MOS semiconductor device according to claim 1, wherein the buried solid insulating region is formed over a bottom plane of the drain region and partly over the bottom plane of the channel region.

3. The MOS semiconductor device according to claim 1, wherein the buried solid insulating region is formed over a bottom plane of the source region and partly over the bottom plane of the channel region.

4. The MOS semiconductor device according to claim 1, wherein the buried insulating region comprises two buried insulating regions which are formed over bottom planes of the source and drain regions, respectively, and which partially extend over the bottom plane of the channel region.

5. The MOS semiconductor device according to claim 1, wherein the buried solid insulating region comprises a single insulating region partially extending over the bottom plane of the channel region.

6. The MOS semiconductor device according to claim 1, wherein the buried solid insulating region is formed of a plurality of insulating subregions which in total partially extend over the bottom plane of the channel region.

7. The MOS semiconductor device according to any one of claims 1 to 6, wherein a field insulating layer is deposited on the semiconductor substrate to surround the source, channel and drain regions.

8. The MOS semiconductor device according to claim 7, wherein a channel stopper region of the first conductivity type is formed below the field insulating layer.

* * * * *